US010289788B1

(12) United States Patent
Kumar et al.

(10) Patent No.: US 10,289,788 B1
(45) Date of Patent: May 14, 2019

(54) SYSTEM AND METHOD FOR SUGGESTING COMPONENTS ASSOCIATED WITH AN ELECTRONIC DESIGN

(71) Applicant: Cadence Design Systems, Inc., San Jose, CA (US)

(72) Inventors: Hitesh Mohan Kumar, Greater Noida (IN); Matthew Timothy Bromley, Portland, OR (US); Vikas Kohli, Noida (IN); Sagar Kumar, Greater Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 189 days.

(21) Appl. No.: 14/954,033

(22) Filed: Nov. 30, 2015

(51) Int. Cl.
*G06F 17/50* (2006.01)
*G06F 16/22* (2019.01)
*G06F 16/28* (2019.01)

(52) U.S. Cl.
CPC .......... *G06F 17/5072* (2013.01); *G06F 16/22* (2019.01); *G06F 16/288* (2019.01); *G06F 17/5068* (2013.01); *G06F 17/5077* (2013.01); *G06F 2217/08* (2013.01); *G06F 2217/74* (2013.01)

(58) Field of Classification Search
None
See application file for complete search history.

(56) References Cited

U.S. PATENT DOCUMENTS

| 6,269,467 B1* | 7/2001 | Chang | G06F 17/5022 716/104 |
| 6,285,369 B1* | 9/2001 | Kross | G06F 17/50 345/419 |
| 6,530,065 B1* | 3/2003 | McDonald | G06F 17/5036 716/102 |
| 6,836,871 B2* | 12/2004 | Lachman | G06F 17/5036 716/136 |
| 6,954,908 B2* | 10/2005 | Subasic | G06F 17/504 716/101 |
| 6,968,515 B2* | 11/2005 | Hashimoto | G06F 17/5045 716/106 |

(Continued)

OTHER PUBLICATIONS

V.S.Pugachev, "The Method of Determining Optimum Systems Using General Bayes Criteria," IRE Transactions on Circuit Theory, Dec. 1960, pp. 491-505. (Year: 1960).*

*Primary Examiner* — Leigh M Garbowski
(74) *Attorney, Agent, or Firm* — Mark H. Whittenberger, Esq.; Holland & Knight LLP

(57) ABSTRACT

The present disclosure relates to a computer-implemented method for electronic design automation. Embodiments may include storing one or more electronic circuit designs at an electronic circuit design database and receiving a user input associated with one of the electronic circuit designs. Embodiments may include scanning the one or more stored electronic circuit designs and generating a network including a relationship graph and a component map, based upon, at least in part, the scanning Embodiments may include generating at least one next neighbor component based upon, at least in part, the network and the received user input. Embodiments may include displaying one or more user-selectable options at a graphical user interface, wherein the user-selectable options include the at least one next neighbor component.

15 Claims, 8 Drawing Sheets

(56) References Cited

U.S. PATENT DOCUMENTS

| | | | | |
|---|---|---|---|---|
| 7,047,168 B2 * | 5/2006 | Carballo | ............... | G06F 17/50 700/97 |
| 7,089,512 B2 * | 8/2006 | Iadanza | ............... | G06F 17/5036 716/102 |
| 7,240,319 B2 * | 7/2007 | Bentley | ............... | G06F 17/50 700/121 |
| 7,324,981 B2 * | 1/2008 | Chickering | ............... | G06N 7/005 701/50 |
| 7,328,420 B1 * | 2/2008 | Datta | ............... | G06F 17/5054 716/102 |
| 7,418,360 B2 * | 8/2008 | Danz | ............... | G06F 17/50 700/21 |
| 7,441,219 B2 * | 10/2008 | Perry | ............... | G06F 17/5045 703/16 |
| 7,523,433 B1 * | 4/2009 | Anderson | ............... | G06F 11/323 707/999.003 |
| 7,568,172 B2 * | 7/2009 | Breyer | ............... | G06F 17/505 716/139 |
| 7,636,650 B2 * | 12/2009 | Khalil | ............... | G06F 17/5004 703/1 |
| 7,707,533 B2 * | 4/2010 | McConaghy | ............... | G06F 17/5022 703/14 |
| 7,707,534 B2 * | 4/2010 | Lambert | ............... | G06F 17/5068 716/119 |
| 8,117,139 B2 * | 2/2012 | Bonabeau | ............... | G06N 3/126 706/13 |
| 8,266,571 B2 * | 9/2012 | Chapman | ............... | G06F 17/5045 716/107 |
| 8,271,909 B2 * | 9/2012 | Majumder | ............... | G06F 17/5081 716/104 |
| 8,782,577 B2 * | 7/2014 | Fischer | ............... | G06F 17/5068 716/100 |
| 8,813,002 B2 * | 8/2014 | Tanisho | ............... | G06F 17/5045 716/101 |
| 9,087,164 B2 * | 7/2015 | Perry | ............... | G06F 17/50 |
| 9,223,923 B2 * | 12/2015 | Amundson | ............... | G06F 17/5081 |
| 9,529,952 B1 * | 12/2016 | Gamsa | ............... | G06F 17/505 |
| 2006/0156268 A1 * | 7/2006 | Wen | ............... | G06F 17/5022 716/102 |
| 2008/0221851 A1 * | 9/2008 | Chen | ............... | G06F 17/5063 703/14 |
| 2009/0241075 A1 * | 9/2009 | Ahmed | ............... | G06F 17/5045 716/136 |
| 2015/0213407 A1 * | 7/2015 | Cabler | ............... | G06Q 50/01 705/300 |

* cited by examiner

SYSTEM AND METHOD FOR SUGGESTING COMPONENTS ASSOCIATED WITH AN ELECTRONIC DESIGN

FIELD OF THE INVENTION

The present disclosure relates to electronic design automation, and more specifically, to a graphical method for suggesting components in an electronic design.

DISCUSSION OF THE RELATED ART

Electronic design automation (EDA) utilizes software tools that may be used in the design and analysis of numerous electronic systems such as printed circuit boards (PCBs) and integrated circuits (ICs). In the context of EDA, schematic design creation involves many manual processes and steps. For example, in operation, a designer may instantiate desired components, connect them, assign constraints and properties to them, place terminations, etc. Many of these tasks are repetitive in nature across different designs. Due to the lack of intelligence in the design tools, the designers may have to re-do many of the steps multiple times and may need to rely on manual, error-prone methods such as copy-paste, tedious template based designs, circuit/block export/import, and/or post process design rule check ("DRC") to transfer data. These approaches may result in data loss, unintentional data arrival and do not have the ability to self-improve or self-learn.

Creating variant designs and anticipating Bill of Materials ("BOM") during design creation are other major areas where designers face tedious manual steps. Moreover, designers are unable to use data from different design tools together to accelerate and simplify their design creation process. Schematic designers are also limited due to the lack of any built-in intelligence in current design capture tools.

SUMMARY

In one or more embodiments of the present disclosure, a computer-implemented method is provided. The method may include receiving, using at least one processor, a user input associated with an electronic circuit design and storing one or more electronic circuit designs at an electronic circuit design database. The method may include scanning the one or more stored electronic circuit designs and generating a network including at least one of a relationship graph and a component map, based upon, at least in part, the scanning. The method may include generating at least one next neighbor component based upon, at least in part, the network and the received user input. The method may include displaying one or more user-selectable options at a graphical user interface, wherein the user-selectable options include the at least one next neighbor component.

One or more of the following features may be included. In some embodiments, the graphical user interface may include displaying the at least one next neighbor component in an order of probability. The method may include, upon user selection, directly instantiating a selected neighbor component at the electronic circuit design. The method may include suggesting a connectivity assignment between the selected neighbor component and at least one additional component. The method may include suggesting an assignment of at least one signal termination. The method may include suggesting an assignment of at least one constraint to the selected neighbor component. In some embodiments, the network may be a Bayes network. The method may further include assigning at least one prior probability to the network based upon, at least in part, a probability algorithm.

In some embodiments, a computer-readable storage medium having stored thereon instructions that when executed by a machine result in one or more operations is provided. Operations may include receiving, using at least one processor, a user input associated with an electronic circuit design and storing one or more electronic circuit designs at an electronic circuit design database. Operations may include scanning the one or more stored electronic circuit designs and generating a network including a relationship graph and a component map, based upon, at least in part, the scanning Operations may include generating at least one next neighbor component based upon, at least in part, the network and the received user input. Operations may include displaying one or more user-selectable options at a graphical user interface, wherein the user-selectable options include the at least one next neighbor component.

One or more of the following features may be included. In some embodiments, the graphical user interface may include displaying the at least one next neighbor component in an order of probability. Operations may include, upon user selection, directly instantiating a selected neighbor component at the electronic circuit design. Operations may include suggesting a connectivity assignment between the selected neighbor component and at least one additional component. Operations may include suggesting an assignment of at least one signal termination. Operations may include suggesting an assignment of at least one constraint to the selected neighbor component. In some embodiments, the network may be a Bayes network. Operations may further include assigning at least one prior probability to the network based upon, at least in part, a probability algorithm.

In one or more embodiments of the present disclosure, a system is provided. The system may include a computing device configured to receive a user input associated with an electronic circuit design and to store one or more electronic circuit designs at an electronic circuit design database. The computing device may be further configured to scan the one or more stored electronic circuit designs and to generate a network including a relationship graph and a component map, based upon, at least in part, the scanning. The computing device may be further configured to generate at least one next neighbor component based upon, at least in part, the network and the received user input and to display one or more user-selectable options at a graphical user interface One or more of the following features may be included. In some embodiments, the graphical user interface may include displaying the at least one next neighbor component in an order of probability. The computing device may be configured to, upon user selection, directly instantiate a selected neighbor component at the electronic circuit design. The computing device may be configured to suggest a connectivity assignment between the selected neighbor component and at least one additional component. The computing device may be configured to suggest an assignment of at least one signal termination. The computing device may be configured to suggest an assignment of at least one constraint to the selected neighbor component. In some embodiments the network may be a Bayes network. The computing device may be configured to assign at least one prior probability to the network based upon, at least in part, a probability algorithm.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
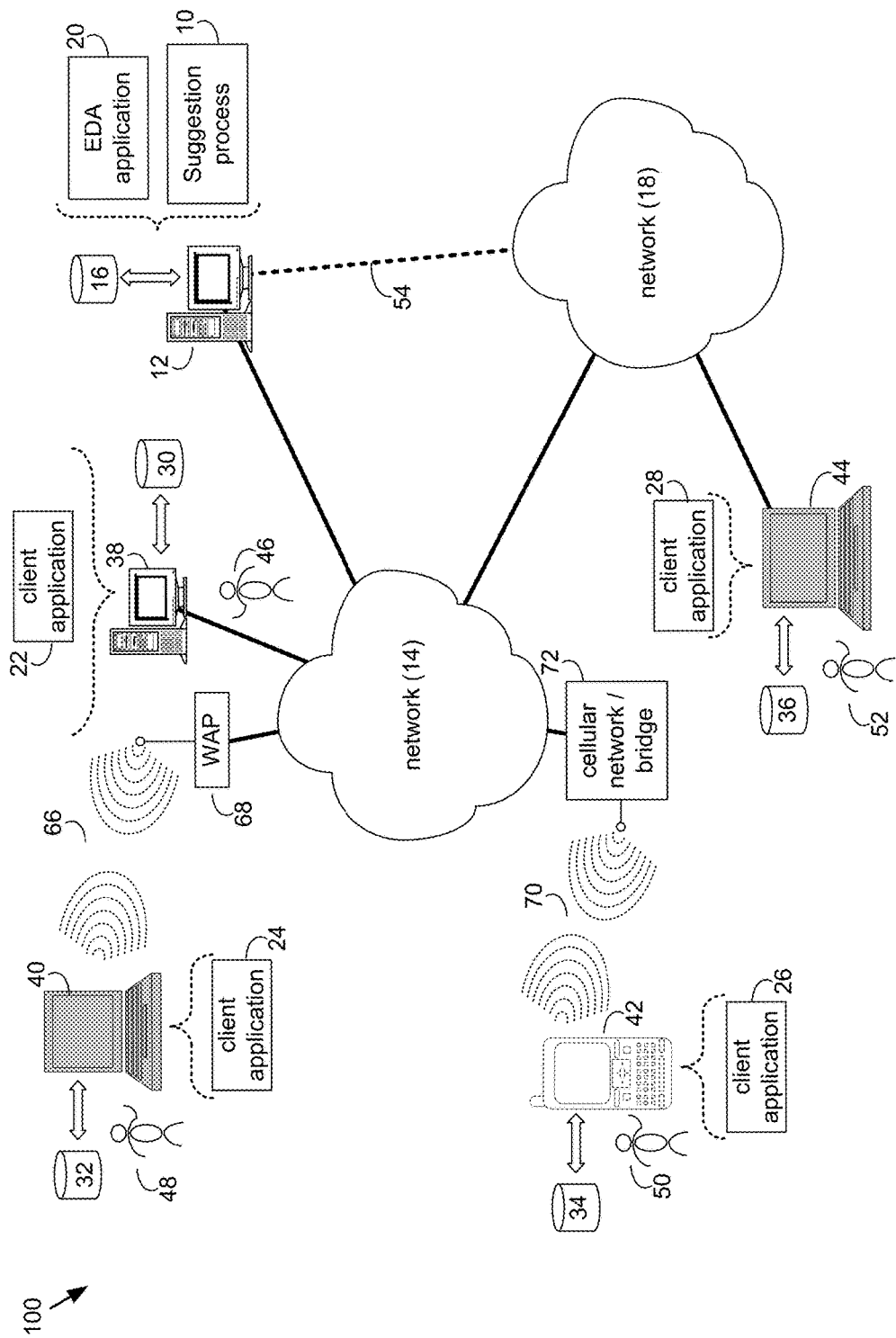
FIG. 1 is a system diagram depicting aspects of the suggestion process in accordance with an embodiment of the present disclosure.

Referring now to FIGS. 1-8, embodiments of the present disclosure relate to a system and method for suggesting actions (e.g. probable or expected next components) in an electronic design. Accordingly, suggestion process 10, shown in FIG. 1, may allow for a simplified schematic design generation process. Embodiments of the present disclosure may perform data mining upon stored electronic designs and may utilize artificial intelligence ("AI") techniques to predict components for a designer to select at a graphical user interface. Accordingly, embodiments of the present disclosure may intelligently predict and suggest the next steps or actions to the designer based on one or more available designs, component relationships and/or design creation history associated with his/her design environment.

Accordingly, embodiments of suggestion process 10 may be configured to provide a mechanism to predict and give real-time feedback to the designer for the next probable components, connections, constraints, terminations etc. that may assist the designer in completing the design creation process faster, which may help to eliminate many manual errors.

In this way, embodiments of suggestion process 10 may improve the designer's experience by using data mining and AI techniques to accelerate and simplify the design creation and validation process. For example, suggestion process may include automatically discovering component libraries and associated components, automatically suggesting component placement using an AI probability solver, establishing connections automatically, assigning terminations and constraints automatically, validating designs real-time in terms of functionality, assisting extensively in creating variants and estimating BOM automatically. Embodiments of suggestion process 10 may be configured to improve over time due to self-learning and by incorporating design data from other design tools. Embodiments of suggestion process 10 may operate on the principles of data mining and prediction using uncertainty (e.g., probability) analysis with the help of AI models and variables.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, there is shown a suggestion process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example.

(Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the suggestion process may reside on and be executed, in whole or in part, by a client electronic device, such as a personal computer, notebook computer, personal digital assistant, or the like.

The instruction sets and subroutines of suggestion process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language ("HDL") files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Suggestion process 10 may be a stand alone application, or may be an applet/application/script that may interact with and/or be executed within EDA application 20. In addition/as an alternative to being a server-side process, the suggestion process may be a client-side process (not shown) that may reside on a client electronic device (described below) and may interact with an EDA client application (e.g., one or more of EDA client applications 22, 24, 26, 28). Further, the suggestion process may be a hybrid server-side/client-side process that may interact with EDA application 20 and an EDA client application (e.g., one or more of client applications 22, 24, 26, 28). As such, the suggestion process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize suggestion process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
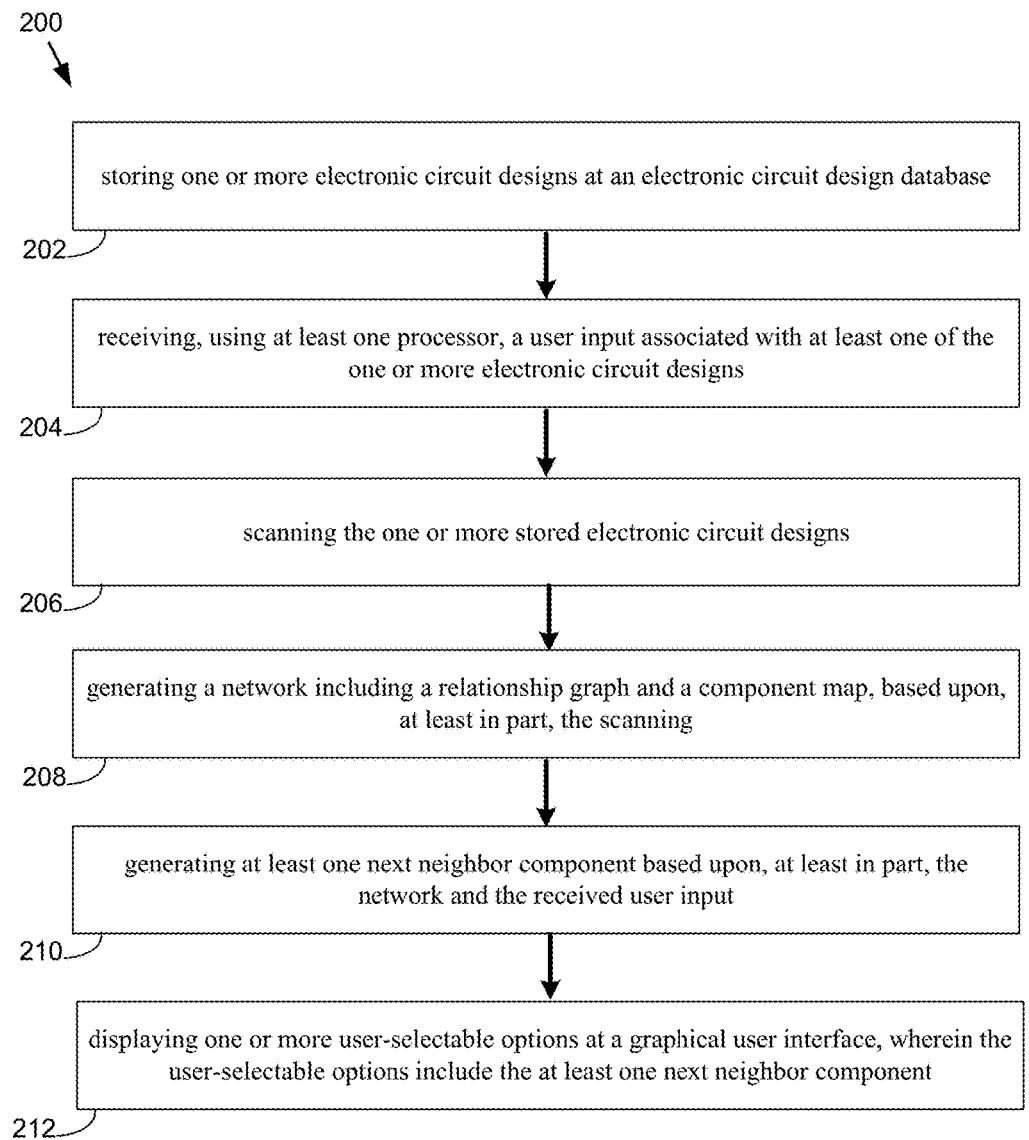
FIG. 2 is a flowchart depicting operations consistent with the suggestion process of the present disclosure.

Referring now to FIG. 2, an embodiment of suggestion process 10 is provided. The process may include storing (202) one or more electronic circuit designs at an electronic circuit design database and receiving (204) using at least one processor, a user input associated with at least one of the one or more electronic circuit designs. Embodiments may include scanning (206) the one or more stored electronic circuit designs and generating (208) a network including at least one of a relationship graph and a component map, based upon, at least in part, the scanning Embodiments may include generating (210) at least one next neighbor component based upon, at least in part, the network and the received user input. Embodiments may include displaying (212) one or more user-selectable options at a graphical user interface, wherein the user-selectable options include the at least one next neighbor component.

Embodiments of suggestion process 10 may utilize the principles of data mining and prediction using uncertainty (e.g., probability) analysis with the help of Artificial Intelligence ("AI") models and variables. The process may operate in multiple stages, including, but not limited to, a design scanning stage and a posterior probability calculation stage. Each of these are discussed in further detail hereinbelow.

In some embodiments, in the design scanning or data mining stage, suggestion process 10 may be configured to scan the available electronic designs and generate a relationship graph of design objects in terms of the AI models and variables. In this way, components, connectivity, constraints, terminations etc., may be mapped as different variables with their relationships to each-other. The design scanner may also attach metadata to the variables for later use. The electronic designs may be stored within any suitable storage device such as storage device 16 shown in FIG. 1.

In some embodiments, the design scanner may be configured to apply equivalence check criteria on components and all other design objects to establish cross-design equivalence of these objects. Based on the appearance of the variables in the sample designs, their prior probabilities may also be calculated and saved by the scanner. The design scanner may additionally provide a method to categorize the designs based on supplied characteristics and then create the category-wise relationship of variables for providing better assistance to the designers during the design creation stage. Accordingly, as more and more designs are created and made available for data mining, the calculation of prior probabilities may become more and more accurate thus resulting in self-learning improvements over time.

In some embodiments, the posterior probability calculation stage may include one or more probability algorithms and/or calculations in order to determine the most appropriate solutions. For example, when a designer starts creating a new design or making amendments in the existing design, embodiments of suggestion process 10 may determine the posterior probability of all remaining variables in the relationship model (e.g., generated by the design scanner) using the AI technique for uncertainty analysis and determining posterior probability based on the current set of evidence. In some embodiments, the already instantiated design objects create the set of evidence variables. Based on the current set of evidence variables, the posterior probability of other associated variables may be computed and real-time feedback may be provided to the user for the next set of probable components, connectivity, constraints, terminations, etc. Embodiments of suggestion process 10 may also suggest to the designer some other characteristics of interest during the design creation process itself, including, but not limited to, BOM anticipation, with the help of associated metadata with the variables and models. Examples consistent with embodiments of suggestion process 10 are provided in FIGS. 3-6, which are discussed in further detail hereinbelow.

Figure 3:
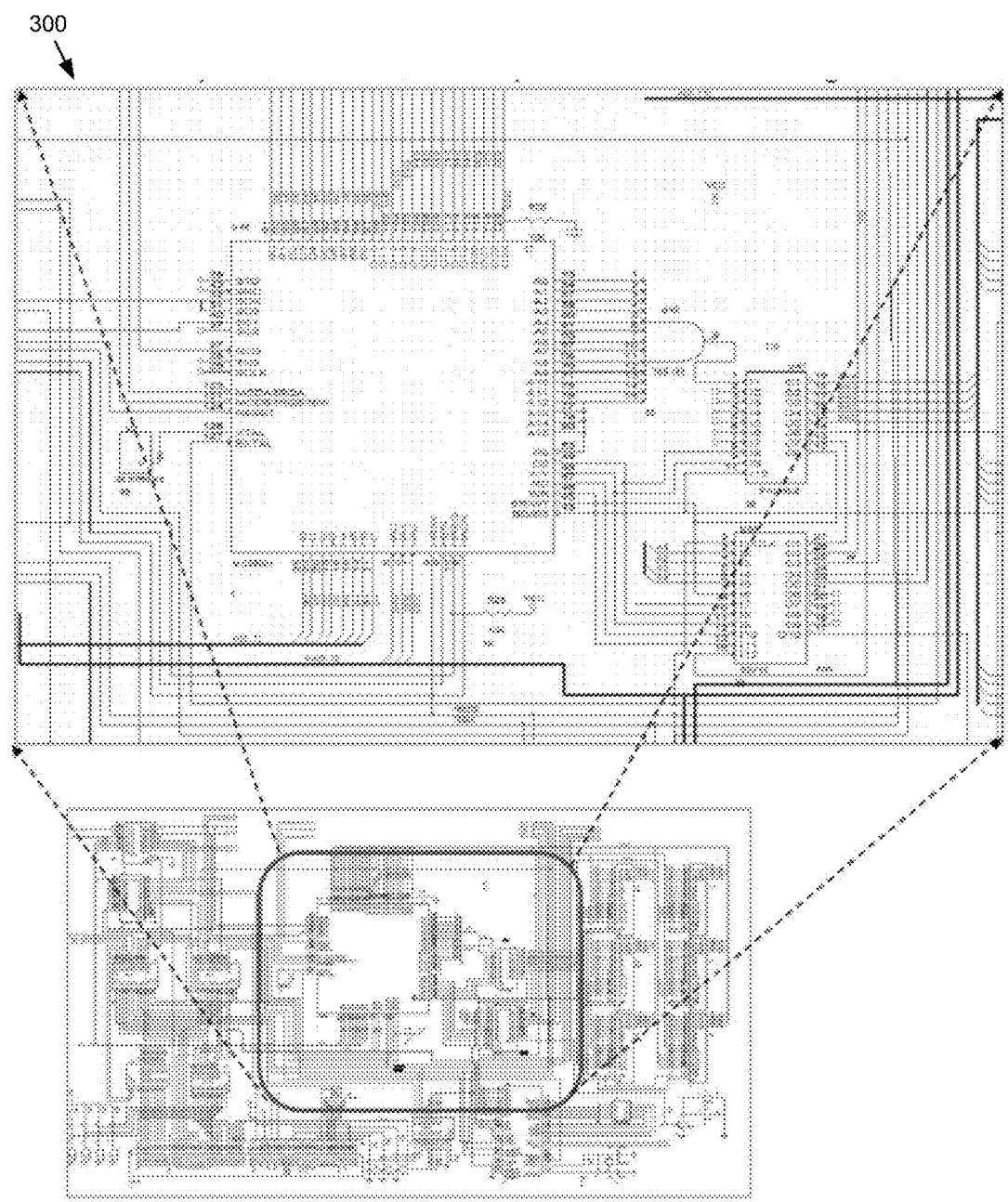
FIG. 3 is a diagram depicting aspects of the suggestion process in accordance with an embodiment of the present disclosure.

Referring now to FIG. 3, an embodiment depicting aspects of the design scanning phase is provided. In this particular example, a design 300 and its different variants (e.g., around 50 such designs) are provided as a sample design set to create a relation model and to compute the prior probability. In this particular example, the Part Number of the component has been used as an equivalence criterion across designs.

Figure 4:
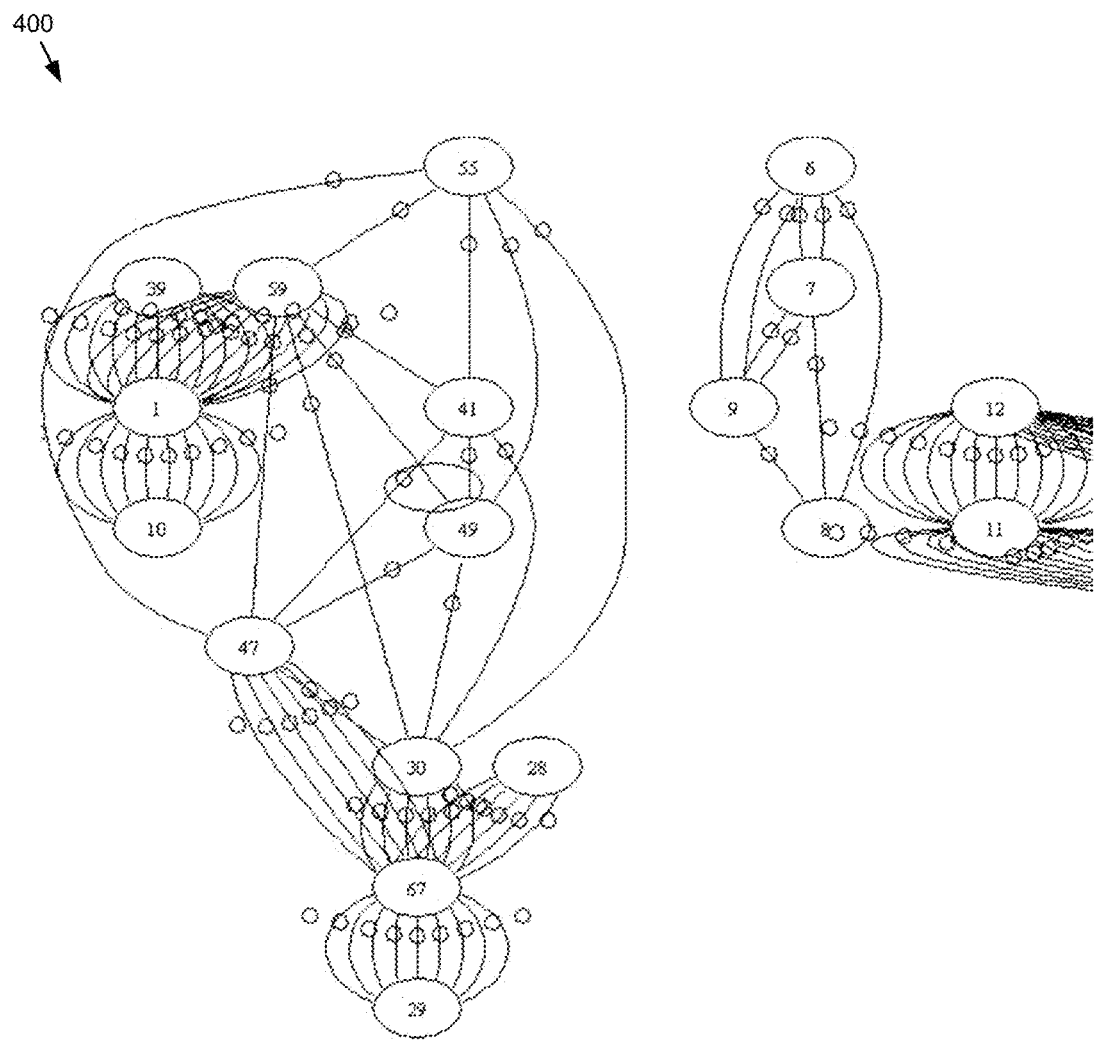
FIG. 4 is a diagram depicting aspects of the suggestion process in accordance with an embodiment of the present disclosure.

In some embodiments, in operation, the design scanner may be configured to create the relationship model of the variables based on component connections. It may then compute the prior conditional probabilities of all relationships and combinations. The relationship model and conditional probabilities may then be serialized for later use in subsequent stages. FIG. 4 depicts an example of the corresponding relationship graph of the design of FIG. 3 in the dot format.

Figure 5:
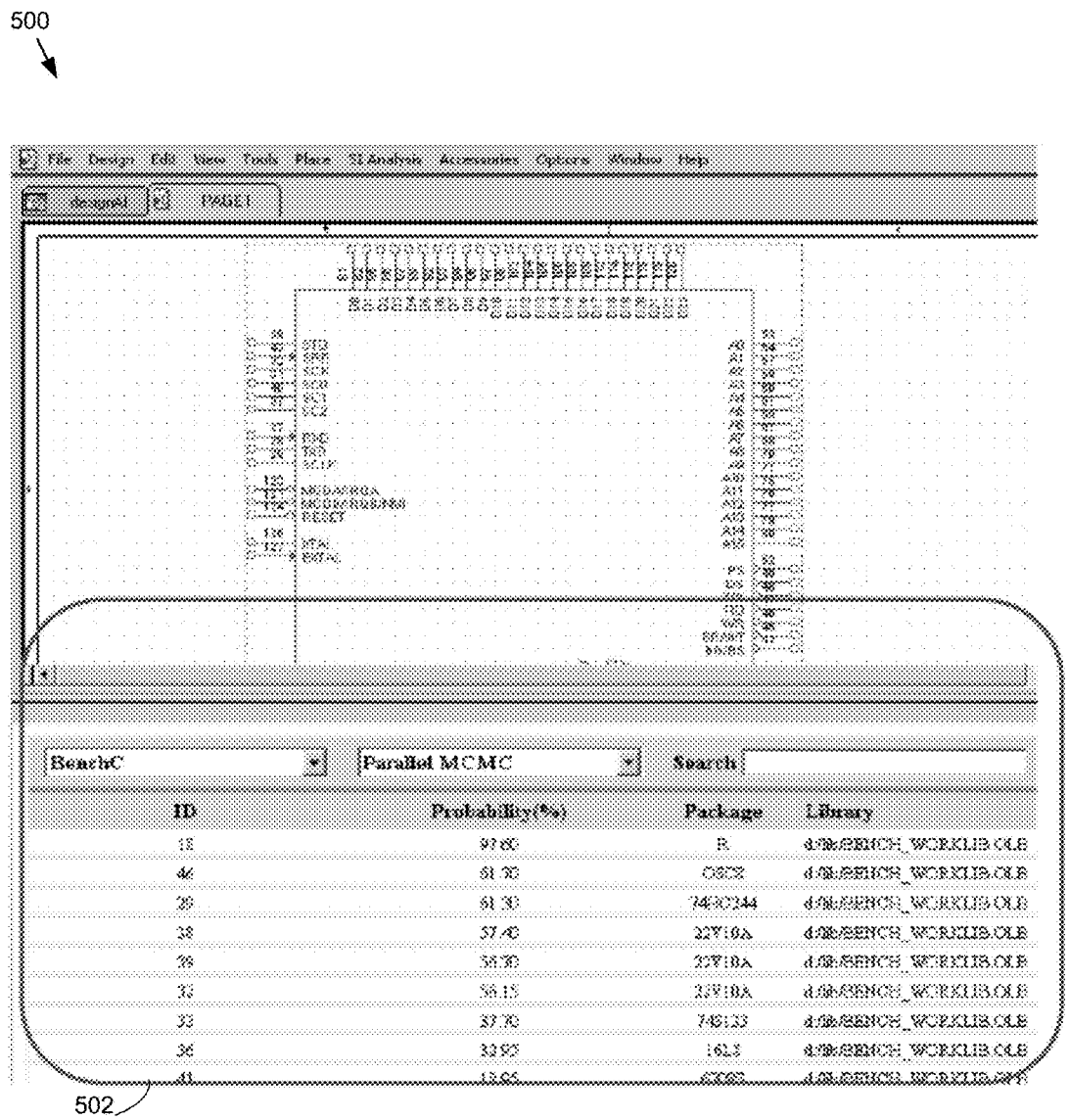
FIG. 5 is a diagram depicting aspects of the suggestion process in accordance with an embodiment of the present disclosure.
Figure 6:
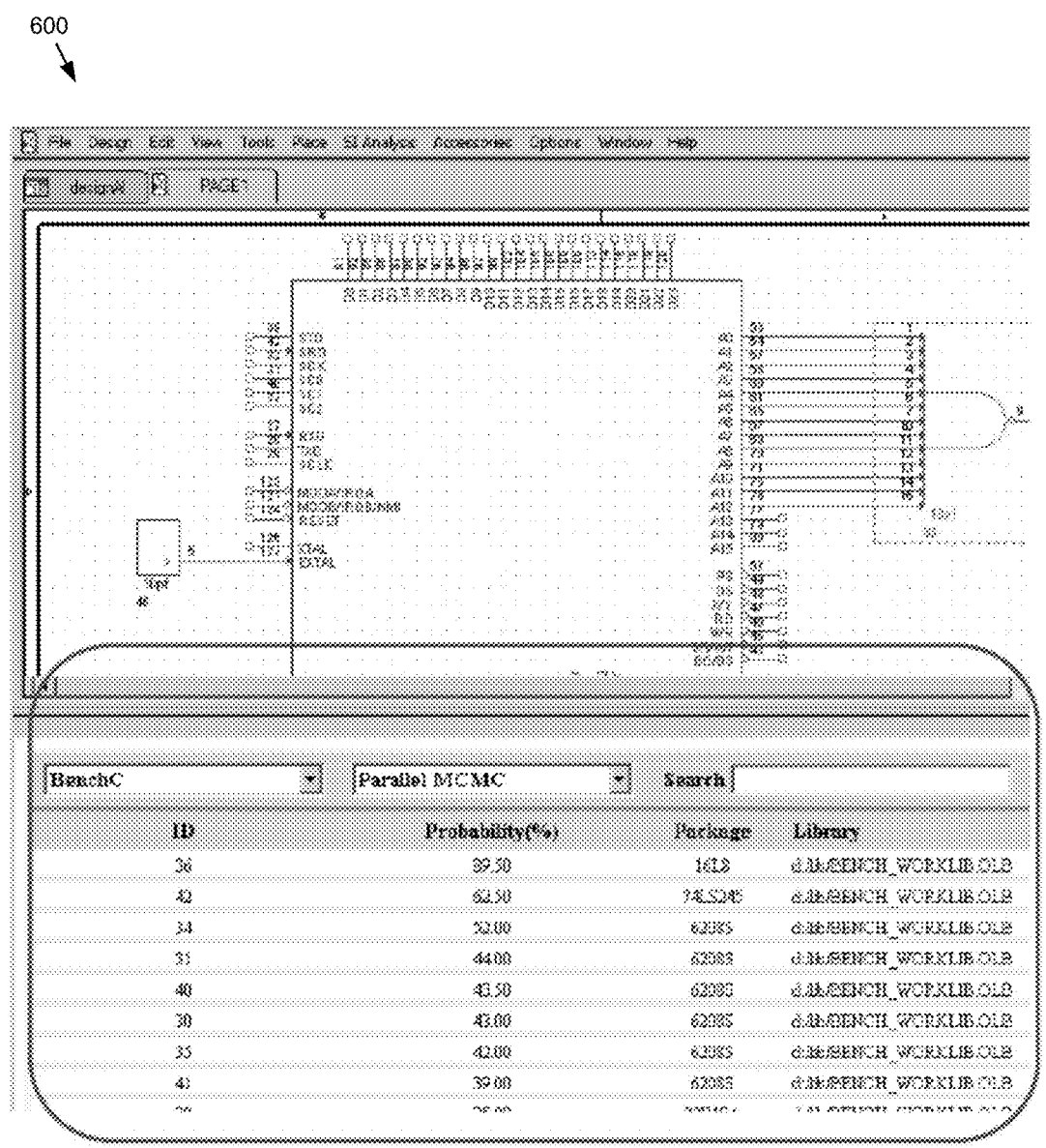
FIG. 6 is a diagram depicting aspects of the suggestion process in accordance with an embodiment of the present disclosure.

Referring also to FIGS. 5-6, embodiments of suggestion process 10 depicting various GUIs (e.g. 500, 600) associated with the posterior probability calculation stage are provided. As shown in the Figures, the posterior probability calculation may be employed when the designer starts creating a new design. For example, and as shown in FIG. 5, when an IC (e.g., "U1") is placed on the schematic by the designer, suggestion process 10 may be configured to calculate the posterior probability of all other probable components based on the current evidence "U1", and may display these probable components in a table, such as table 502. In this particular example, suggestion process 10 has detected that there is a very high probability (e.g., 97.60%) of a resistor that needs to be placed. Similarly, suggestion process 10 has detected that an oscillator has the probability of 61.70%. Other components of varying probabilities are also shown and within the scope of the present disclosure. In operation, the designer may be provided with a user-selectable option to then select any of the probable components from the table and suggestion process 10 may then instantiate the selected probably component directly on the schematic.

In some embodiments, as soon as the designer instantiates one or more components, the posterior probability of other probable components may be automatically computed again and the table may be updated in real-time. For example, after the designer instantiates U1 (IC), R1 (Resistor), U3 (Oscillator) and U2 (Gate) along with some other components in the schematic, suggestion process 10 may suggest that there is a very high probability (e.g., 89.5%) of another IC (16L8) coming into the schematic as is shown in FIG. 6.

Accordingly, and as shown in the Figures, suggestion process 10 may be configured to automatically discover the component libraries by employing data mining techniques on previously created designs. In this way, the designer may be presented with a direct method to select the component from those libraries. Suggestion process 10 may also automatically suggest the next components to be placed as well as their respective probability values using the data mining and AI based probability solver. Additionally and/or alternatively, suggestion process 10 may automatically suggest a number of operations and possible components. Some of these may include, but are not limited to, the connectivity assignment between the placed components values, the assignment of terminations to signals, the assignment of constraints and properties to components and connections, etc. As an example, the user may add a DDR3 SDRAM memory. As soon as the memory is placed, suggestion process 10 may suggest that the user needs to terminate the specific signals of the memory with specific termination schemes found in the other similar designs or blocks.

In some embodiments, suggestion process 10 may provide real-time feedback to the user using a number of different mechanisms. Some of these may include, but are not limited to, real-time feedback on design validation in terms of the functionality, real-time feedback on missing constraints, real-time feedback on missing terminations, etc. As an example, the user may add a processor and a DDR3 Dimm. As soon as he/she finishes the connectivity, suggestion process 10 may suggest that there are three designs with a similar circuit and may ask if the user wants to review and copy constraints onto the DDR3 from any of them. Accordingly, suggestion process 10 may allow the user to review the topology and constraints and, if needed, copy them over.

Figure 7:
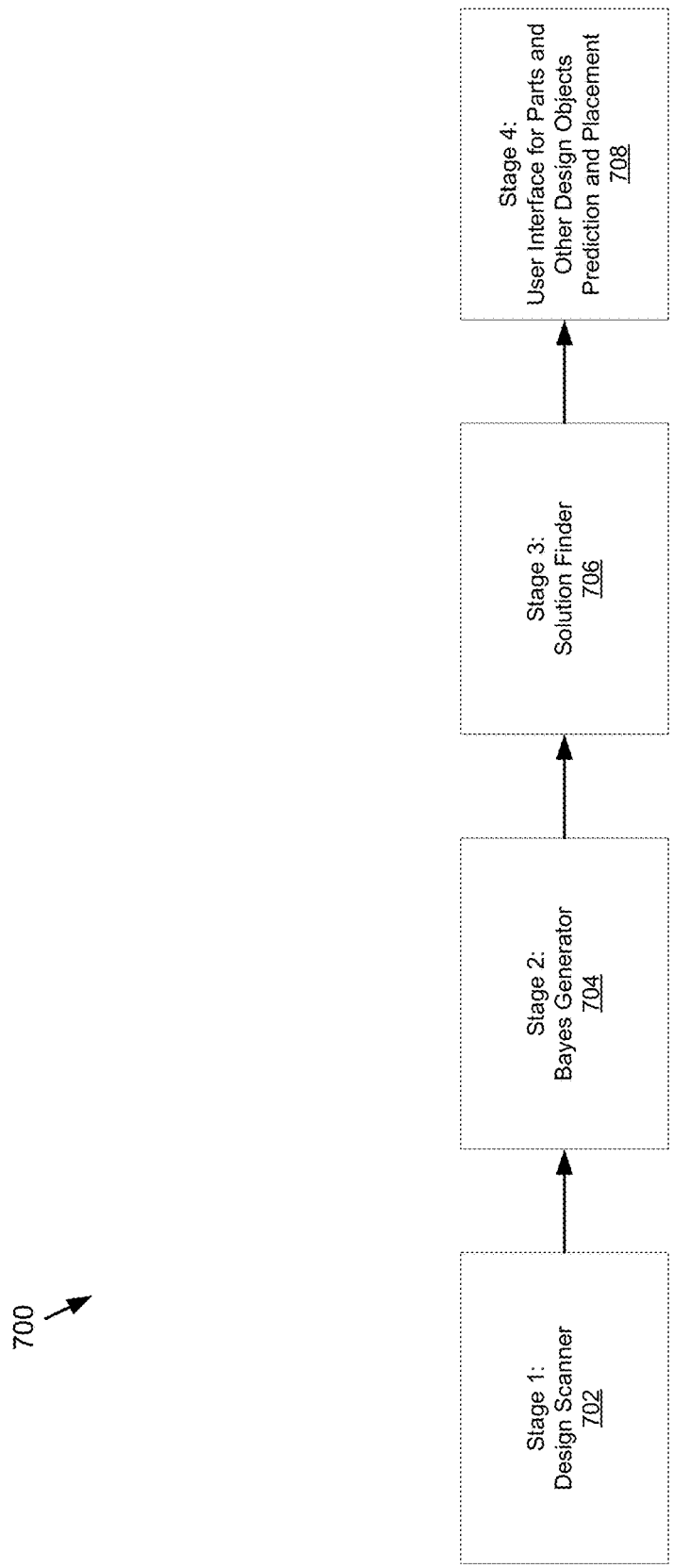
FIG. 7 is a diagram depicting aspects of the suggestion process in accordance with an embodiment of the present disclosure.
Figure 8:
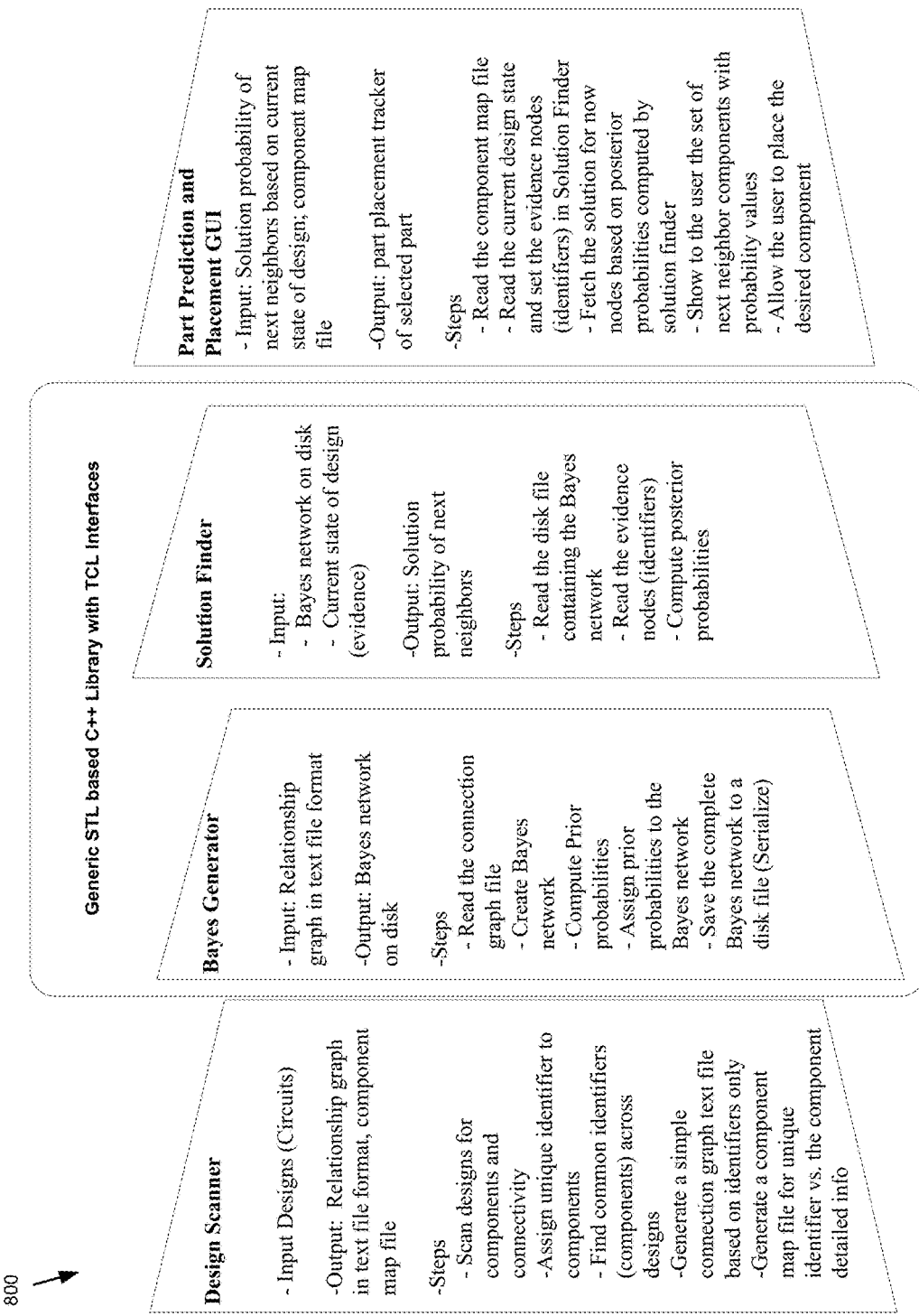
FIG. 8 is a diagram depicting aspects of the suggestion process in accordance with an embodiment of the present disclosure.

Referring now to FIGS. 7-8, embodiments of suggestion process 10 depicting diagrams 700 and 800 consistent with a design environment are provided. FIG. 7 includes a design scanning phase 702, Bayes Generator phase 704, solution finder phase 706, and a graphical user interface ("GUI") phase 708.

In some embodiments, in the design scanning phase 702, the designer (or a CAD administrator, etc.) may specify the location of the design repository. Suggestion process 10 may scan all the designs and create the relationship models of all components and other design objects as a batch process. The design scanning stage may include, but is not limited to, the inputs, outputs and operations identified below. The inputs may include various electronic circuit designs and suggestion process 10 may generate various outputs, some of which may include, but are not limited to, relationship graphs (e.g., text file format), component map files, etc. During the design scanning phase, suggestion process 10 may be configured to scan designs for components, connectivity and other design objects of interest. Additionally and/or alternatively, suggestion process 10 may be configured to assign unique identifier to components and to locate common identifiers across designs. Suggestion process 10 may be configured to generate a simple connection graph text file based on identifiers and/or to generate a component map file for a unique identifier vs. the component detailed information.

In some embodiments, in Bayes Generator phase 704, the output from design scanning phase 702 may be received (e.g., a relationship graph in text file format). Phase 704 may be configured to generate and/or export a Bayes network with prior probabilities assigned. This stage may run as a batch process. In operation, phase 704 may include reading the connection graph text file, generating the Bayes network in memory, computing prior probabilities, assigning prior probabilities to the Bayes network, and saving the complete Bayes network to a disk file (e.g., serialize).

In some embodiments, solution finder phase 706 may include the core algorithm run on the Bayes network based on the current state (e.g., set of evidence nodes) of the design in creation. This stage may run various configurable algorithms to compute the posterior probabilities. Some of these may include, but are not limited to, Join tree (Clique) algorithm, Sequential Marcov Chain Monte Carlo (Sequential MCMC) algorithm, Parallel Marcov Chain Monte Carlo (Parallel MCMC) algorithm, etc. Based on the sample data density, suggestion process 10 may automatically choose the suitable algorithm. For example, if the density is low, it suggestion process 10 may be configured to use the Join tree algorithm which is computation intensive but gives exact inference. Similarly, when the density is quite high, suggestion process 10 may switch to Parallel MCMC, which uses approximation for determining inference. It should be noted that although some of the embodiments included herein are in the context of the "OrCAD Capture" design environment, these embodiments are merely provided by way of example and that suggestion process 10 may be used in any suitable electronic design environment.

In some embodiments, solution finder phase 706 may receive the Bayes network (e.g., on disk) and the current state of the electronic design as evidence nodes. Solution finder phase 706 may be configured to generate the solution probability of next neighbor components and other design objects.

In operation, solution finder phase 706 may read the disk file containing the Bayes network and read the evidence nodes (e.g., identifiers) set by the application. This phase may include running any of the algorithms discussed above on the Bayes network to compute posterior probability and subsequently return the posterior probability values to the calling application.

In some embodiments, GUI phase 708 may include a GUI that is configured to display a prediction and/or placement for parts and other design objects. This GUI may allow the designer to select the appropriate object from the generated set of next probable solutions and to automatically generate and display it on the electronic design. Phase 708 may receive the current design state and/or component map file as inputs. In some embodiments, suggestion process 10 may generate a GUI that may display the solution probability of next neighbor components, connectivity assignments (e.g. connectivity assignment between the placed components, existing methods like auto-route or manual route may then be used to make those connections), constraint assignments, termination schemes, etc. The GUI may also be configured to allow the user to place or assign some or all of these elements. In operation, phase 708 of suggestion process 10 may read the component map file and/or the current design state and set the evidence nodes (e.g., identifiers) in from the solution finder. Suggestion process 10 may be configured to determine the solution for new nodes based on posterior probabilities computed by the solution finder. The set of next neighbor components and other design objects with probability values may be displayed to the user at the GUI. Additionally and/or alternatively, suggestion process 10 may allow the user to place/assign the desired component or other design objects on the electronic design.

Embodiments of the suggestion process 10 may provide many advantages over existing approaches. For example, suggestion process 10 may provide a powerful AI capability in a schematic design tool thus vastly improving design productivity. Suggestion process 10 may also help in minimizing manual errors while capturing the design or while creating the variant designs. Embodiments of suggestion process 10 provide a self-learning method which may automatically improve over time, thus generating improved results. Embodiments of suggestion process 10 may be extended for use in existing applications or tools. Some of these may include, but are not limited to, front end schematic design tools for design creation process acceleration, design tools for BOM estimation, layout design tools, data management tools, tools for project estimation, tools that plan to leverage the data mining for calculating or estimating inference, etc.

As discussed above, embodiments of suggestion process 10 may provide an automated approach for anticipating BOM while creating the designs. In some embodiments, suggestion process 10 may be configured to extend the teachings of the present disclosure to Internet (as shown in FIG. 1). In this way, suggestion process 10 may operate in conjunction with the EDA tools of multiple environments (e.g., desktop, over the Internet, etc.)

In some embodiments, EDA application 20 and/or suggestion process 10 may support a variety of languages and/or standards. EDA application 20 may support one or more software extensions and may be used in conjunction with one or more EDA tools such as those available from the Assignee of the subject application.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method in an electronic design comprising:
   storing one or more electronic circuit designs at an electronic circuit design database;
   receiving, using at least one processor, a user input associated with at least one of the one or more electronic circuit designs;
   scanning the one or more stored electronic circuit designs;
   generating a Bayes network including at least one of a relationship graph and a component map, based upon, at least in part, the scanning;
   generating at least one expected next component based upon, at least in part, the Bayes network and the received user input;
   displaying one or more user-selectable options at a graphical user interface, wherein the user-selectable options include the at least one expected next component displayed at the graphical user interface in an order of probability, wherein the at least one expected next component is based upon, at least in part, one or more available designs, one or more component relationships and a user's particular design history stored in the electronic circuit design database; and
   upon user selection, directly instantiating a selected expected next component on a schematic associated with the electronic circuit design.

2. The computer-implemented method of claim 1, further comprising:
   suggesting a connectivity assignment between the selected expected next component and at least one additional component.

3. The computer-implemented method of claim 1, further comprising:
   suggesting an assignment of at least one signal termination.

4. The computer-implemented method of claim 1, further comprising:
   suggesting an assignment of at least one constraint to the selected expected next component.

5. The computer-implemented method of claim 1, further comprising:

assigning at least one prior probability to the network based upon, at least in part, a probability algorithm.

6. A non-transitory computer-readable storage medium having stored thereon instructions that when executed by a machine result in the following operations:

storing one or more electronic circuit designs at an electronic circuit design database;

receiving, using at least one processor, a user input associated with at least one of the one or more electronic circuit designs;

scanning the one or more stored electronic circuit designs;

generating a Bayes network including at least one of a relationship graph and a component map, based upon, at least in part, the scanning;

generating at least one expected next component based upon, at least in part, the Bayes network and the received user input;

displaying one or more user-selectable options at a graphical user interface, wherein the user-selectable options include the at least one expected next component displayed at the graphical user interface in an order of probability, wherein the at least one expected next component is based upon, at least in part, one or more available designs, one or more component relationships and a user's particular design history stored in the electronic circuit design database; and upon user selection, directly instantiating a selected expected next component on a schematic associated with the electronic circuit design.

7. The computer-readable storage medium of claim 6, wherein operations further comprise:

suggesting a connectivity assignment between the selected expected next component and at least one additional component.

8. The computer-readable storage medium of claim 6, wherein operations further comprise:

suggesting an assignment of at least one signal termination.

9. The computer-readable storage medium of claim 6, wherein operations further comprise:

suggesting an assignment of at least one constraint to the selected expected next component.

10. The computer-readable storage medium of claim 6, wherein operations further comprise:

assigning at least one prior probability to the network based upon, at least in part, a probability algorithm.

11. A system comprising:

a computing device including one or more processors configured to store one or more electronic circuit designs at an electronic circuit design database, the computing device further configured to receive a user input associated with at least one of the one or more electronic circuit designs, the computing device further configured to scan the one or more stored electronic circuit designs and to generate a Bayes network including at least one of a relationship graph and a component map, based upon, at least in part, the scanning, the computing device further configured to generate at least one expected next component based upon, at least in part, the Bayes network and the received user input and to display one or more user-selectable options at a graphical user interface, wherein the user-selectable options include the at least one expected next component displayed at the graphical user interface in an order of probability, wherein the at least one expected next component is based upon, at least in part, one or more available designs, one or more component relationships and a user's particular design history stored in the electronic circuit design database, the computing device further configured to, upon user selection, directly instantiating a selected expected next component on a schematic associated with the electronic circuit design.

12. The system of claim 11, wherein the computing device is further configured to suggest a connectivity assignment between the selected expected next component and at least one additional component.

13. The system of claim 11, wherein the computing device is further configured to suggest an assignment of at least one signal termination.

14. The system of claim 11, wherein the computing device is further configured to suggest an assignment of at least one constraint to the selected expected next component.

15. The system of claim 11, wherein the computing device is further configured to assign at least one prior probability to the network based upon, at least in part, a probability algorithm.

* * * * *